United States Patent
Jung et al.

(10) Patent No.: US 9,111,635 B2
(45) Date of Patent: Aug. 18, 2015

(54) STATIC RANDOM ACCESS MEMORIES (SRAM) WITH READ-PREFERRED CELL STRUCTURES, WRITE DRIVERS, RELATED SYSTEMS, AND METHODS

(71) Applicants: QUALCOMM Incorporated, San Diego, CA (US); Industry-Academic Cooperation Foundation, Yonsei University, Seoul (KR)

(72) Inventors: Seong-Ook Jung, Gyeongggi-Do (KR); Younghwi Yang, Seoul (KR); Bin Yang, San Diego, CA (US); Zhongze Wang, San Diego, CA (US); Choh fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

(21) Appl. No.: 13/869,110

(22) Filed: Apr. 24, 2013

(65) Prior Publication Data

US 2014/0211546 A1    Jul. 31, 2014

Related U.S. Application Data

(60) Provisional application No. 61/757,044, filed on Jan. 25, 2013.

(51) Int. Cl.
*G11C 11/00*   (2006.01)
*G11C 11/412*  (2006.01)
*G11C 11/419*  (2006.01)

(52) U.S. Cl.
CPC ............ *G11C 11/412* (2013.01); *G11C 11/419* (2013.01); *Y10T 29/41* (2015.01)

(58) Field of Classification Search
CPC ............................ G11C 11/412; G11C 11/413
USPC .................................................. 365/154, 156
See application file for complete search history.

(56) References Cited

U.S. PATENT DOCUMENTS

| | | | |
|---|---|---|---|
| 6,219,271 | B1 | 4/2001 | Ishida |
| 7,820,512 | B2 | 10/2010 | Pillarisetty et al. |
| 7,826,252 | B2 | 11/2010 | Wang et al. |
| 2006/0274569 | A1 | 12/2006 | Joshi et al. |
| 2007/0201273 | A1* | 8/2007 | Chuang et al. ........... 365/185.07 |
| 2008/0157225 | A1 | 7/2008 | Datta et al. |

(Continued)

OTHER PUBLICATIONS

International Search Report and Written Opinion—PCT/US2014/012474—ISA/EPO—Mar. 27, 2014.

(Continued)

*Primary Examiner* — Huan Hoang
(74) *Attorney, Agent, or Firm* — Withrow & Terranova, PLLC

(57) ABSTRACT

Static random access memories (SRAM) with read-preferred cell structures and write drivers are disclosed. In one embodiment, the SRAM has a six transistor bit cell. The read-preferred bit cell is implemented by providing two inverters, each having a pull up transistor, a pull down transistor and a pass gate transistor. Each pull up transistor is associated with a feedback loop. The feedback loop improves random static noise margin. Each transistor has a width and a length. The lengths of the pass gate transistors are increased. The widths of the pull down transistors are equal to one another and also equal to the widths of the pass gate transistors. The widths of the pass gate and pull down transistors may also be increased relative to prior designs. A write assist circuit may also be used to improve performance.

19 Claims, 5 Drawing Sheets

(56) References Cited

U.S. PATENT DOCUMENTS

2010/0195373 A1* 8/2010 Kim .............................. 365/154
2012/0026808 A1    2/2012 Houston et al.
2012/0228714 A1    9/2012 Lim et al.
2014/0036578 A1* 2/2014 Jung et al. .................... 365/154

OTHER PUBLICATIONS

Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, Nov. 2006, pp. 2366-2372.

Yang Y., et al., "Read-Preferred SRAM Cell With Write-Assist Circuit Using Back-Gate ETSOI Transistors in 22-nm Technology," IEEE Transactions on Electron Devices, Oct. 2012, vol. 59 (10), pp. 2575-2581.

Second Written Opinion for PCT/US2014/012474, mailed Feb. 4, 2015, 5 pages.

Communication in Cases for Which No Other Form Is Applicable for International Patent Application No. PCT/US2014/012474 mailed Apr. 20, 2015, 2 pages.

International Preliminary Report on Patentability for PCT/US2014/012474, mailed May 11, 2015, 19 pages.

* cited by examiner

STATIC RANDOM ACCESS MEMORIES (SRAM) WITH READ-PREFERRED CELL STRUCTURES, WRITE DRIVERS, RELATED SYSTEMS, AND METHODS

PRIORITY CLAIM

The present application claims priority to U.S. Provisional Patent Application Ser. No. 61/757,044 filed on Jan. 25, 2013 and entitled "STATIC RANDOM ACCESS MEMORIES (SRAM) WITH READ-PREFERRED CELL STRUCTURES," which is incorporated herein by reference in its entirety.

BACKGROUND

I. Field of the Disclosure

The technology of the disclosure relates generally to static random access memories (SRAM) with improved performance characteristics.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components within the circuitry.

Miniaturization of the components impacts all aspects of the processing circuitry including the memory transistors and other reactive elements in the processing circuitry. While miniaturization of components in mobile communication devices is easy for the consumer to appreciate as phones become smaller and lighter and have longer battery times, miniaturization pressures are not limited to mobile communication devices. Computing devices ranging from mobile communication devices to desktop computers to servers and the like all benefit from miniaturization efforts. In particular, almost all of these devices have various forms of memory such as dynamic random access memory (DRAM) and static random access memory (SRAM).

A basic SRAM bit cell structure relics on six transistors that form two cross-coupled inverters that store each memory bit. A typical SRAM uses metal oxide field effect transistors (MOSFETs) for each of the six transistors. The smaller the transistors, the more transistors may be placed in a given amount of space in a memory chip and the more memory that the memory chip can provide.

As SRAM is miniaturized to the twenty-two nanometer (22 nm) scale and smaller, the geometries associated with these reduced scales preclude compliance with a 6σ yield. That is, the 6σ standard requires that 99.99966% of the devices are free from defects and meet the design criteria. In particular, SRAM designers have defined a number of parameters, including three noise parameters (e.g., Static Noise Margin (SNM), Hold Static Noise Margin (HSNM), and Write Ability Margin (WAM)) and the basic six transistor (6T) design fails to meet 6σ in both the SNM and the WAM parameters. Accordingly, there is a desire amongst memory designers to improve the SNM and WAM parameters of SRAM bit cells.

SUMMARY OF THE DISCLOSURE

Embodiments disclosed in the detailed description include static random access memories (SRAM) with read-preferred cell structures and write drivers. Related systems and methods are also disclosed. The SRAM has a six transistor bit cell. The read-preferred bit cell is implemented by providing two inverters, each having a pull up transistor, a pull down transistor and a pass gate transistor. Each pull up transistor is associated with a feedback loop. The feedback loop improves random static noise margin (RSNM). Each transistor has a width and a length. The lengths of the pass gate transistors are increased, which further improves the RSNM, albeit with a slightly larger cell space and a decreased $I_{cell}$. The widths of the pull down transistors are equal to one another and also equal to the widths of the pass gate transistors. This provides a lithography-friendly layout and an improved $I_{cell}$. Additionally, RSNM is slightly degraded. The widths of the pass gate and pull down transistors may also be increased relative to prior designs to reach the target RSNM and to improve $I_{cell}$. If the read-preferred bit cell is not enough to meet 6σ design criteria, a write assist circuit may also be used to improve performance. The write assist circuit includes a write driver that has two outputs. The first output couples to the bit line source for the first inverter and the back-gate bias of the pass gate and pull down transistors in the second inverter. The second output couples to the bit line bar source for the second inverter and the back-gate bias of the pass gate and pull down transistors of the first inverter. This structure improves the word line write trip voltage (WWTV) and does not require an additional voltage generator.

In this regard in one embodiment, a SRAM is disclosed. The SRAM comprises a first inverter comprising a first pull up transistor and a first pull down transistor, and the first pull up transistor comprising a first back-gate feedback loop, the first pull down transistor having a first width ($W_{PD1}$). The SRAM also comprises a second inverter comprising a second pull up transistor and a second pull down transistor, and the second pull up transistor comprising a second back-gate feedback loop, the second pull down transistor having a second width ($W_{PD2}$) substantially equal to $W_{PD1}$. The SRAM also comprises a first pass gate (PG) transistor associated with the first inverter, wherein the first PG transistor comprises a first PG width ($W_{PG1}$) substantially equal to $W_{PD1}$. The SRAM also comprises a second PG transistor associated with the second inverter wherein the second PG transistor has a second PG width ($W_{PG2}$) substantially equal to $W_{PD2}$.

In another embodiment, a SRAM is disclosed. The SRAM comprises first means for inverting comprising a first pull up transistor and a first pull down transistor, and the first pull up transistor comprising a first back-gate feedback loop, the first pull down transistor having $W_{PD1}$. The SRAM also comprises second means for inverting comprising a second pull up transistor and a second pull down transistor, and the second pull up transistor comprising a second back-gate feedback loop, the second pull down transistor having $W_{PD2}$ substantially equal to $W_{PD1}$. The SRAM also comprises a first PG means associated with the first means for inverting, wherein the first PG means comprises $W_{PG1}$ substantially equal to $W_{PD1}$. The SRAM also comprises a second PG means associated with the second means for inversion wherein the second PG means has $W_{PG2}$ substantially equal to $W_{PD2}$.

In another embodiment, a method of forming a SRAM is disclosed. The method comprises forming a first inverter comprising a first pull up transistor and a first pull down transistor, and the first pull up transistor comprising a first back-gate feedback loop, the first pull down transistor having $W_{PD1}$. The method also comprises forming a second inverter comprising a second pull up transistor and a second pull down transistor, and the second pull up transistor comprising a second back-gate feedback loop, the second pull down transistor having $W_{PD2}$ substantially equal to $W_{PD1}$. The method also comprises associating a first PG transistor with the first inverter, wherein the first PG transistor comprises $W_{PG1}$ substantially equal to $W_{PD1}$. The method also comprises associating a second PG transistor with the second inverter wherein the second PG transistor has $W_{PG2}$ substantially equal to $W_{PD2}$.

In another embodiment, a SRAM is disclosed. The SRAM comprises a write driver comprising two outputs, a first output of the two outputs connected to a bit line source and a first back-gate transistor, a second output of the two outputs connected to a bit line bar source and a second back-gate transistor.

In another embodiment, a SRAM is disclosed. The SRAM comprises a means for driving a write command comprising two outputs, a first output of the two outputs connected to a bit line source and a first back-gate transistor, a second output of the two outputs connected to a bit line bar source and a second back-gate transistor.

BRIEF DESCRIPTION OF TILE FIGURES

DETAILED DESCRIPTION

Figure 1:
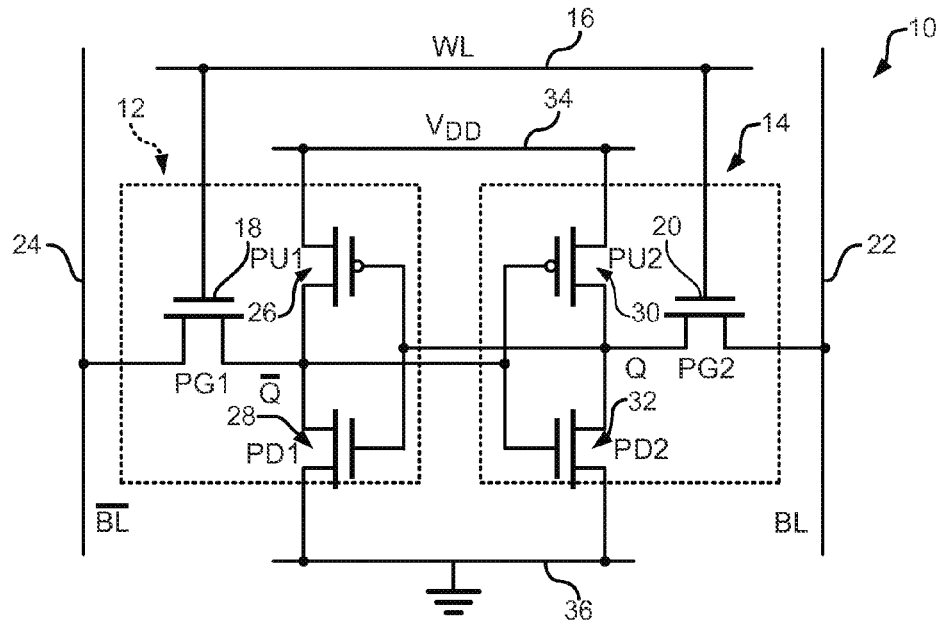
FIG. 1 is a schematic diagram of an exemplary conventional six transistor (6T) static random access memory (SRAM) circuit.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include static random access memories (SRAM) with read-preferred cell structures and write drivers. Related systems and methods are also disclosed. The SRAM has a six transistor (6T) bit cell. The read-preferred bit cell is implemented by providing two inverters, each having a pull up transistor, a pull down transistor and a pass gate transistor. Each pull up transistor is associated with a feedback loop. The feedback loop improves random static noise margin (RSNM). Each transistor has a width and a length. The lengths of the pass gate transistors are increased, which further improves the RSNM, albeit with a slightly larger cell space and a decreased $I_{cell}$. The widths of the pull down transistors are equal to one another and also equal to the widths of the pass gate transistors. This provides a lithography-friendly layout and an improved $I_{cell}$. Additionally, RSNM is slightly degraded. The widths of the pass gate and pull down transistors may also be increased relative to prior designs to reach the target RSNM and to improve $I_{cell}$. If the read-preferred bit cell is not enough to meet 6σ design criteria, a write assist circuit may also be used to improve performance. The write assist circuit includes a write driver that has two outputs. The first output couples to the bit line source for the first inverter and the back-gate bias of the pass gate and pull down transistors in the second inverter. The second output couples to the bit line bar source for the second inverter and the back-gate bias of the pass gate and pull down transistors of the first inverter. This structure improves the word line write trip voltage (WWTV) and does not require an additional voltage generator.

Figure 2:
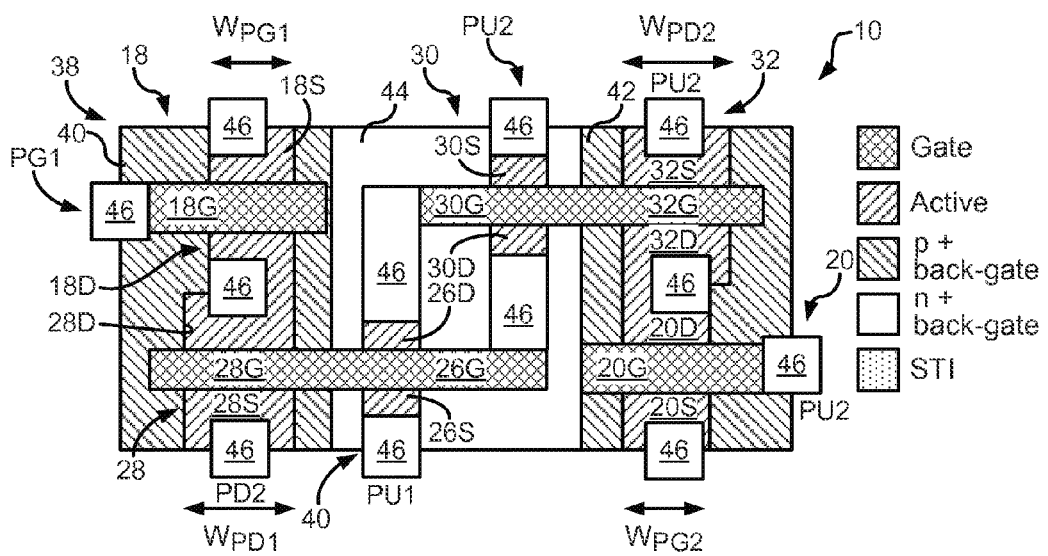
FIG. 2 is a simplified top plan view of the circuit of FIG. 1.

Before addressing embodiments of the SRAM with read-preferred circuitry, a brief overview of a conventional 6T SRAM is provided with reference to FIGS. 1 and 2. The discussion of embodiments of the SRAM with read-preferred circuitry begins with reference to FIG. 3 below.

In this regard, FIG. 1 is an electrical schematic of an exemplary embodiment of a conventional 6T SRAM 10 having a first inverter 12 and a second inverter 14. A word line 16 couples to both inverters 12, 14. In particular, the word line 16 couples to the first inverter 12 through a gate of a first pass gate (PG) transistor 18 (PG1) and couples to the second inverter 14 through a gate of a second PG transistor 20 (PG2). A bit line 22 couples to a drain of the second PG transistor 20. A bit line bar 24 couples to a source of the first PG transistor 18.

With continued reference to FIG. 1, the first inverter 12 includes a first pull up (PU) transistor 26 (PU1) and a first pull down (PD) transistor 28 (PD1). The second inverter 14 includes a second PU transistor 30 (PU2) and a second PD transistor 32 (PD2). A voltage source $V_{DD}$ 34 couples to the first and second PU transistors 26, 30. The PD transistors 28, 32 are coupled to ground 36.

The 6T SRAM 10 of FIG. 1 has a physical layout as illustrated in FIG. 2. The transistors 18, 20, 26, 28, 30, and 32 are positioned on a substrate 38 on which p-wells 40 and 42 are created. Additionally, an n-well 44 is created. The sources and drains are created in active areas created within the p-wells 40, 42, and the n-well 44. The source and drains for each of the transistors 18, 20, 26, 28, 30, and 32 are denoted by the letter S and the letter D. Thus, for example, the source for the first PD transistor 28 is denoted 28S, the drain for the second PU transistor 30 is denoted 30D and the like. Similarly, the gates for each of the transistors 18, 20, 26, 28, 30, and 32 are denoted by the letter G (e.g., the gate for the first PG transistor 18 is 18G). The gates are formed over the substrate 38 and contacts 46 are added as is conventional. Of interest is the width ($W_{PD}$) of the PD transistors 28, 32 relative to the width ($W_{PG}$) of the PG transistors 18, 20. In most conventional SRAM 10, $W_{PG}$ is smaller than $W_{PD}$. As noted, SRAM made according to conventional techniques such as SRAM 10 do not meet the 6σ manufacturing threshold when the device size is at or below twenty-two nanometers (22 nm). Thus, there is a need to design SRAM devices that do meet the 6σ manufacturing threshold at sizes at or below 22 nm.

Figure 3:
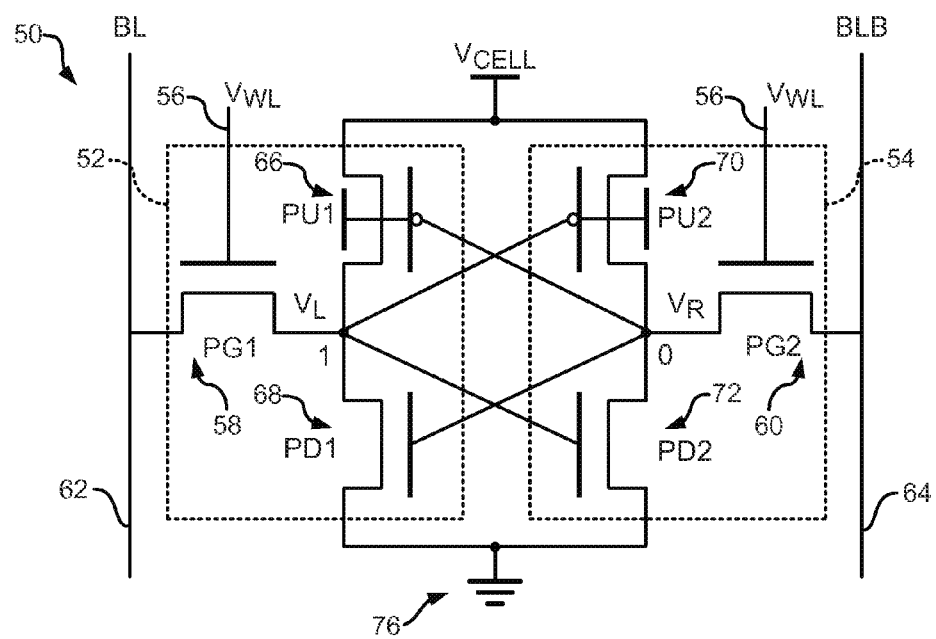
FIG. 3 is schematic diagram of an exemplary embodiment of a 6T SRAM according to the present disclosure.

The present disclosure provides an SRAM that meets the 6σ manufacturing threshold by providing a read-preferred bit cell and an optional write assist circuit in conjunction with the 6T SRAM. In this regard, FIG. 3 illustrates a circuit diagram of SRAM 50, SRAM 50 includes a first inverter 52 and a second inverter 54. The first inverter 52 and the second inverter 54 are also sometimes referred to as a means for inverting. A word line 56 couples to both inverters 52, 54. In particular the word line 56 couples to the first inverter 52 through a gate of a first PG transistor 58 (PG1) and couples to the second inverter 54 through a gate of a second PG transistor 60 (PG2). A bit line 62 couples to a drain of the first PG transistor 58. A bit line bar 64 couples to a source of the second PG transistor 60.

With continued reference to FIG. 3, the first inverter 52 includes a first PU transistor 66 (PU1) and a first PD transistor 68 (PD1). The second inverter 54 includes a second PU transistor 70 (PU2) and a second PD transistor 72 (PD2). A voltage source $V_{CELL}$ couples to the first and second PU transistors 66, 70. The PD transistors 68, 72 are coupled to ground 76.

With continued reference to FIG. 3, the PU transistors 66, 70 have a feedback or back-gate. That is, the back-gate of the PU transistor 66, 70 is connected to its gate contact. During a read operation, the PU transistor 66 connected to the "1" storage node is forward-biased, which increases the trip voltage ($V_{trip}$) of the first inverter 52 and thus increases the RSNM, but it slightly decreases the WWTV. Note that PU feedback does not affect $I_{cell}$ or $I_{leak}$. Testing shows that the use of the PU feedback does not, by itself, increase the RSNM to 6σ, but does raise it to about 4.8σ.

Figure 4:
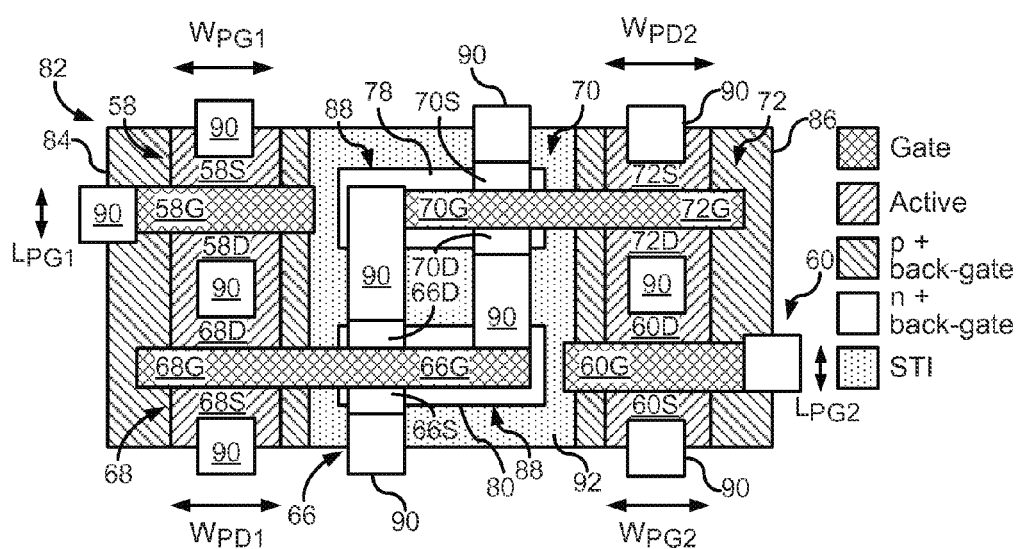
FIG. 4 is a simplified top plan view of the circuit of FIG. 3 with the pull up feedback presented.

To achieve the desired 6σ threshold, further changes are required to the structure of the SRAM 50 as illustrated in FIG. 4. The top plan view of SRAM 50 provided in FIG. 4 illustrates the PU back-gates 78, 80 as well as the transistors 58, 60, 66, 68, 70, 72 positioned on a substrate 82 having p-wells 84, 86 and an n-well 88.

With continued reference to FIG. 4, the sources and drains are created in active areas created within the p-wells 84, 86 and the n-well 88. The source and drains for each of the transistors 58, 60, 66, 68, 70, and 72 are denoted by the letter S and the letter D. Thus, for example, the source for the first PD transistor 68 is denoted 68S, the drain for the second PU transistor 70 is denoted 70D and the like. Similarly, the gates for each of the transistors 58, 60, 66, 68, 70, and 72 are denoted by the letter G the gate for the first PG transistor 58 is 58G). The gates are formed over the active area and contacts 90 are added as is conventional. Note that transistors 66, 70 may be isolated from each other and other transistors 58, 60, 68, and 72 by shallow trench isolation (STI) 92. Two physical changes in the dimensions of the elements within the SRAM 50 are provided to assist in meeting the 60 manufacturing threshold. First, the width ($W_{PD}$) of the PD transistors 68, 72 is made equal to the $W_{PG}$ of the PG transistors 58, 60. Second, the length of the PG transistors 58, 60 ($L_{PG}$) is increased. These two steps improve the beta ratio (i.e., the ratio of the PD to PG transistor strength), which in turn, improves the RSNM. Increasing $L_{PG}$ greatly improves the RSNM with a small cell overhead, but it degrades the $I_{cell}$ and WWTV. In an exemplary embodiment, $L_{PG}$ is increased to 26.5 nm from 22 nm. $W_{PG}$ in an exemplary conventional SRAM 10 may be 42 nm and $W_{PD}$ in that exemplary conventional SRAM 10 may be 55 nm. Increasing $W_{PG}$ to be equal to $W_{PD}$ improves $I_{cell}$ without causing extra space to be used beyond what is already required for the width of $W_{PD}$. This same size further makes for a lithography friendly layout. While expanding $W_{PG}$ degrades the RSNM, the degradation is not significant. Further, if expanding $W_{PG}$ alone does not give the desired 6σ results, $W_{PD}$ (and correspondingly matching $W_{PG}$) may be slightly increased. In an exemplary embodiment, both $W_{PG}$ and $W_{PD}$ are increased from 55 nm to 63 nm.

While adding the PU back-gate feedback, increasing $L_{PG}$, and increasing $W_{PG}$ and $W_{PD}$ are effective at reaching the 6σ threshold, there may be occasions when these changes are not sufficient to provide the desired 6σ criteria. Accordingly, the present disclosure provides an improved write-assist circuit.

Figure 5:
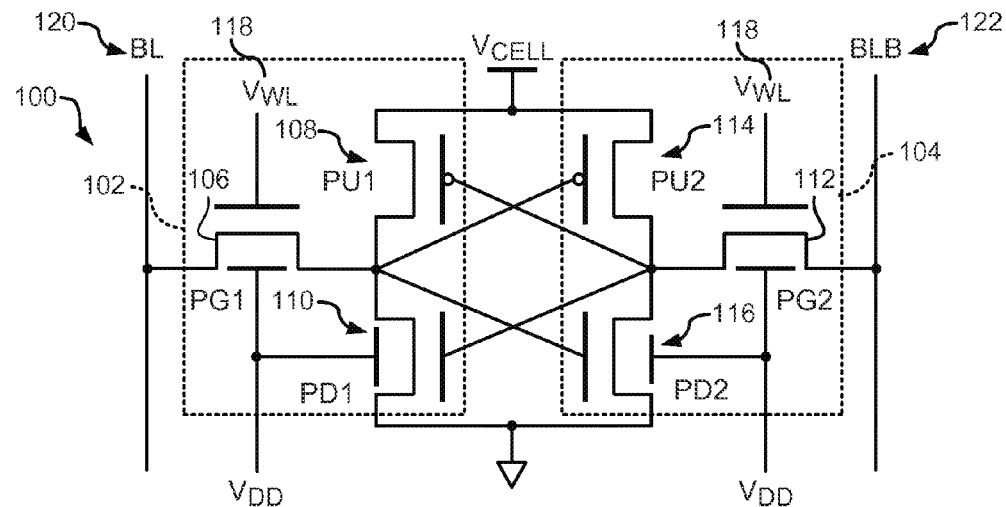
FIG. 5 is a schematic diagram of an exemplary conventional 6T SRAM with a write assist circuit.

Before addressing the improved write-assist circuit, a brief discussion of the prior art write-assist circuit is provided with reference to FIG. 5.

In this regard, FIG. 5 illustrates an exemplary SRAM 100 with a write-assist circuit. The SRAM 100 includes a first inverter 102 and a second inverter 104. The first inverter 102 includes a first PG transistor 106, a first PU transistor 108, and a first PD transistor 110. The second inverter 104 includes a second PG transistor 112, a second PU transistor 114, and a first PD transistor 116. A word line 118 couples to the inverters 102, 104 through the respective PG transistors 106, 112. A bit line source 120 couples to the first inverter 102 through the first PG transistor 106. A bit line bar source 122 couples to the second inverter 104 through the second PG transistor 112. The back-gates of the first PG transistor 106, first PD transistor 110, second PG transistor 112, and second PD transistor 116 are coupled to $V_{DD}$ which requires a large power overhead by the assist circuit, in an alternate embodiment (not illustrated specifically), the back-gates of the first PG transistor 106, first PD transistor 110, second PG transistor 112, and second PD transistor 116 are coupled to ground and controlled simultaneously. Since the back-gates and the ground are controlled simultaneously, WWTV can be improved with a smaller voltage swing. However, this arrangement requires an additional voltage generator and power line. These additions increase circuit complexity and routing. Further, these additions consume additional power and increase the area required by the circuit.

The present disclosure provides a write assist circuit that addresses problems raised in the design of SRAM 100 of FIG. 5. Specifically, with reference to FIGS. 6 and 7, an SRAM 121 is provided. The SRAM 121 includes a first inverter 123 and a second inverter 124. The first inverter 123 includes a first PG transistor 126, a first PU transistor 128, and a first PD transistor 130. The second inverter 124 includes a second PG transistor 132, a second PU transistor 134, and a second PD transistor 136. The PU transistors 128, 134 may include a back-gate feedback as explained above with reference to FIGS. 3 and 4. A bit line source 138 is coupled to the first inverter 123 through the first PG transistor 126. A bit line bar source 140 is coupled to the second inverter 124 through the second PG transistor 132. The first PG transistor 126 and the first PD transistor 130 each have a back-gate that is coupled to a write driver 142 and in particular coupled to a first output 144. The first output 144 is also coupled to the bit line bar source 140. The second PG transistor 132 and the second PD transistor 136 also have respective back-gates that are coupled to the write driver 142 and in particular are coupled to a second output 146 of the write driver 142. The second output 146 is also coupled to the bit line source 138.

Figure 7:
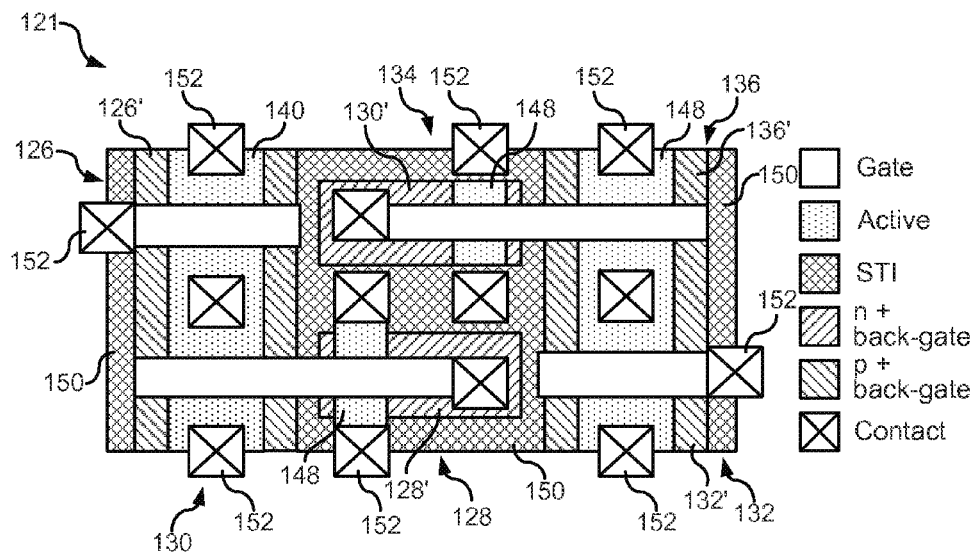
FIG. 7 is a simplified top plan view of the circuit of FIG. 6.

The physical layout of the SRAM 121 is provided in FIG. 7. The transistors 126, 128, 130, 132, 134, and 136 are formed on active area 148. STI 150 provides isolation between various ones of the transistors 126, 128, 130, 132, 134, and 136. Back-gates 126', 128', 130', 132', 134', and 136' are formed underneath the respective transistors 126, 128, 130, 132, 134, and 136. Contacts 152 provide the appropriate connections to the transistors 126, 128, 130, 132, 134, and 136.

Figure 6:
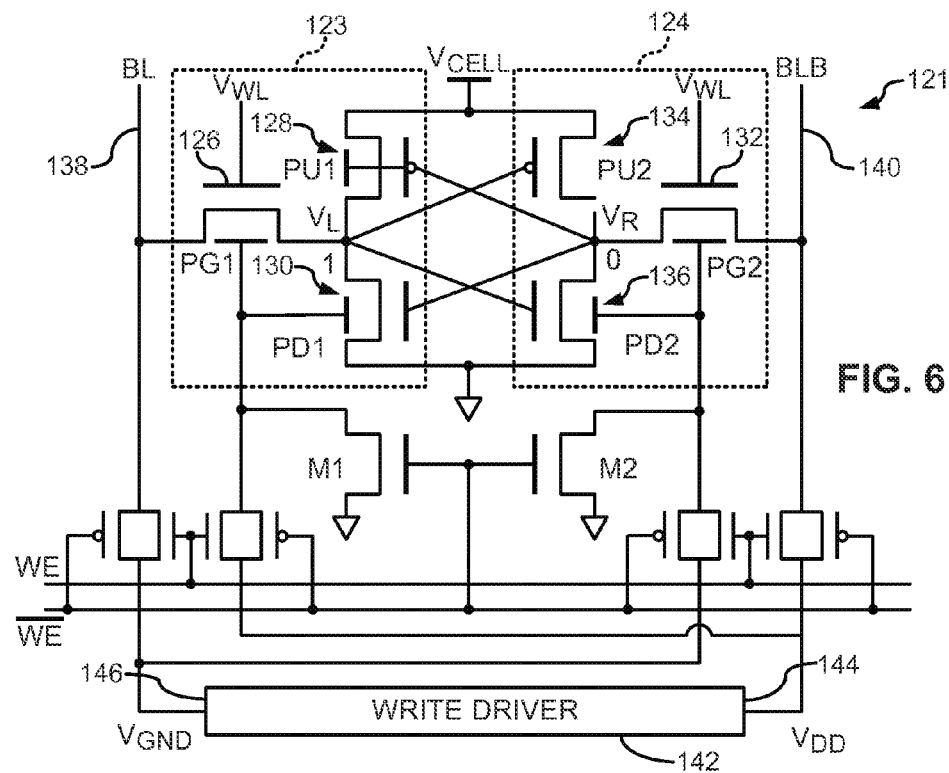
FIG. 6 is a schematic diagram of an exemplary 6T SRAM with a write assist circuit according to the present disclosure.

By providing the write assist circuit set forth in FIGS. 6 and 7, the back-gate node of each inverter 123, 124 is connected to the opposite side of the write driver 142. The back-gate bias is only applied to the inverter on the one side that can improve the WWTV. It can reduce the dynamic power needed by the assist circuit relative to the embodiment of FIG. 5. In addition, this structure does not require an additional voltage generator.

A method 157 for forming the SRAM 50, 121 is explained with reference to FIG. 8. Initially, the substrate is chosen and appropriate active areas and n-wells/p-wells are formed. A first inverter (52, 123) is formed with PU transistors (66, 128) and PD transistors (68, 130). A back-gate feedback loop is formed for the first PU transistor (66, 128) (block 152). The first PD transistor (68, 130) has a width $W_{PD1}$. A second inverter (54, 124) is formed with PU transistors (70, 134) and PD transistors (72, 136). A back-gate feedback loop is formed for the second PU transistor (70, 134) (block 154). The second PD transistor (72, 136) has a width $W_{PD2}$. The inverters 52, 123, 54, 124 are also associated with PG transistors 58, 60, 126, 132 having respective widths $W_{PGx}$.

Figure 8:
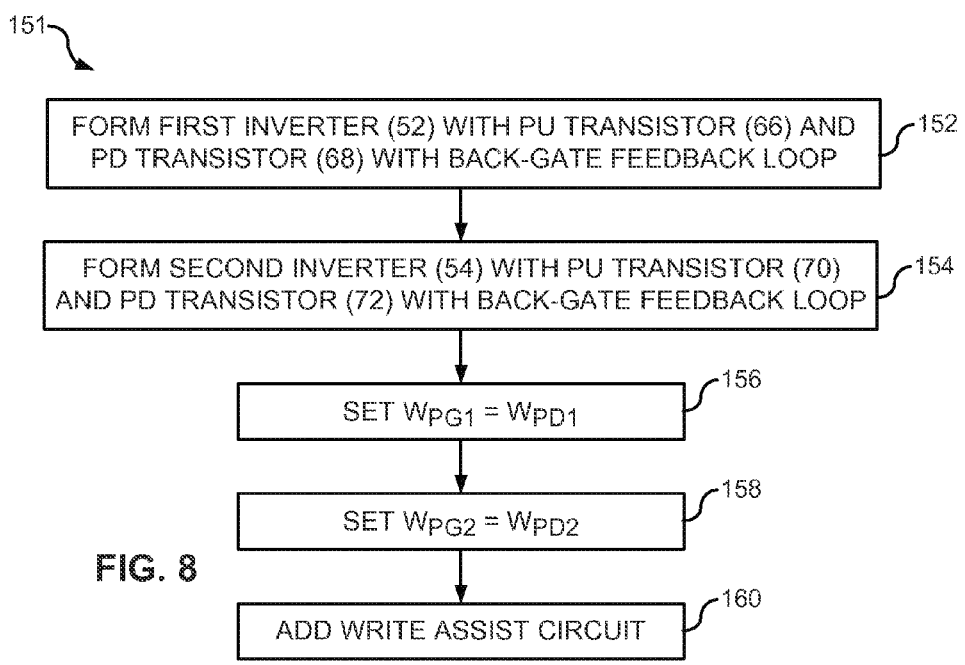
FIG. 8 is a flowchart illustrating an exemplary process for forming the 6T SRAM of FIGS. 3 and/or 6.

With continued reference to FIG. 8, the method 157 continues by setting $W_{PG1}=W_{PD1}$ (block 156) and setting $W_{PG2}=W_{PD2}$ (block 158). Optionally a write assist circuit may be provided (block 160).

The SRAM with read-preferred cell structures, write drivers, and related systems and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
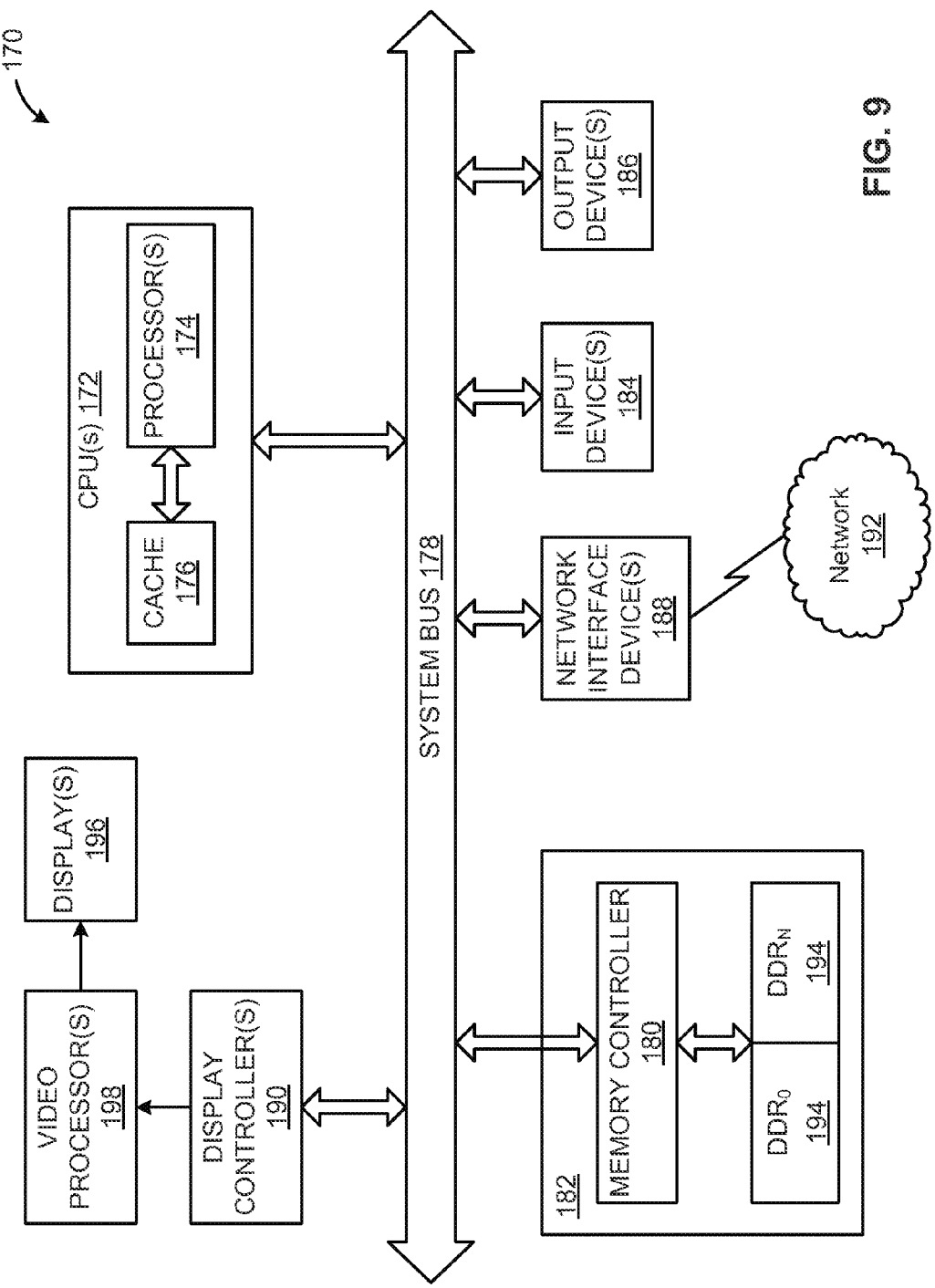
FIG. 9 is a block diagram of an exemplary processor-based system that can include the SRAM of FIGS. 3 and/or 6.

In this regard, FIG. 9 illustrates an example of a processor-based system 170 that can employ the SRAM 50, 121 illustrated in FIGS. 3 and 6. In this example, the processor-based system 170 includes one or more central processing units (CPUs) 172, each including one or more processors 174. The CPU(s) 172 may be a master device. The CPU(s) 172 may have cache memory 176 coupled to the processor(s) 174 for rapid access to temporarily stored data. The CPU(s) 172 is coupled to a system bus 178 and can intercouple master devices and slave devices included in the processor-based system 170. As is well known, the CPU(s) 172 communicates with these other devices by exchanging address, control, and data information over the system bus 178. For example, the CPU(s) 172 can communicate bus transaction requests to the memory controller 180 as an example of a slave device. Although not illustrated in FIG. 9, multiple system buses 178 could be provided, wherein each system bus 178 constitutes a different fabric.

Other master and slave devices can be connected to the system bus 178. As illustrated in FIG. 9, these devices can include a memory system 182, one or more input devices 184, one or more output devices 186, one or more network interface devices 188, and one or more display controllers 190, as examples. The input device(s) 184 can include any type of input device, including but not limited to input keys, switches, voice processors, etc. The output device(s) 186 can include any type of output device, including but not limited to audio, video, other visual indicators, etc. The network interface device(s) 188 can be any devices configured to allow exchange of data to and from a network 192. The network 192 can be any type of network, including but not limited to a wired or wireless network, private or public network, a local area network (LAN), a wide local area network (WLAN), and the Internet. The network interface device(s) 188 can be configured to support any type of communication protocol desired. The memory system 182 can include one or more memory units 194 (0-N), which may include one or more of the SRAM 50, 121.

The CPU(s) 172 may also be configured to access the display controller(s) 190 over the system bus 178 to control information sent to one or more displays 196. The display controller(s) 190 sends information to the display(s) 196 to be displayed via one or more video processors 198, which process the information to be displayed into a format suitable for the display(s) 196. The display(s) 196 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM), comprising:
   a write driver comprising two outputs, wherein:
      a first output of the two outputs is connected to a bit line source and a back-gate of a second pull down (PD) back-gate transistor; and
      a second output of the two outputs is connected to a bit line bar source and a back-gate of a first PD back-gate transistor.

2. The SRAM of claim 1, further comprising:
   a first inverter comprising a first pull up (PU) back-gate transistor and the first PD back-gate transistor, each of the first PU back-gate transistor and the first PD back-gate transistor comprising a back-gate feedback loop, the first PD back-gate transistor having a first width ($W_{PD1}$);
   a second inverter comprising a second PU back-gate transistor and the second PD back-gate transistor, each of the second PU back-gate transistor and the second PD back-gate transistor comprising a back-gate feedback loop, the second PD back-gate transistor having a second width ($_{WPD2}$) substantially equal to $W_{PD1}$;
   a first pass gate (PG) transistor associated with the first inverter, the first PG transistor comprising a first PG width ($Wp_{PG2}$) substantially equal to $W_{PD1}$; and
   a second PG transistor associated with the second inverter, the second PG transistor comprising a second PG width ($W_{PD2}$) substantially equal to $W_{PD2}$.

3. The SRAM of claim 2, wherein the first PG transistor comprises a first length ($L_{PG1}$) and the second PG transistor comprises a second length ($L_{PG2}$) substantially equal to $L_{PG1}$.

4. The SRAM of claim 3, wherein:
   the first PU transistor has a first length ($L_{PU1}$);
   the second PU transistor has a second length ($L_{PU2}$) substantially equal to $L_{PU1}$;
   the first PD transistor has a first length ($L_{PD1}$);
   the second PD transistor has a second length ($L_{PD2}$) substantially equal to $L_{PD1}$;
   $L_{PG1}$ is greater than $L_{PU1}$ and $L_{PD1}$; and
   $L_{PG2}$ is greater than $L_{PU2}$ and $L_{PD2}$.

5. The SRAM of claim 2, wherein:
   $W_{PD1}$ is greater than a first width of the first PU back-gate transistor ($W_{PU1}$); and
   $W_{PD1}$ is greater than a second width of the second PU back-gate transistor ($W_{PU2}$).

6. The SRAM of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the SRAM is integrated.

7. The SRAM of claim 2, wherein the second output of the write driver controls a back-gate bias of the first PG transistor but not a back-gate bias of the second PG transistor.

8. The SRAM of claim 2, wherein the SRAM is configured to comply with 6σ. design criteria.

9. The SRAM of claim 1 integrated into an SRAM array comprising a plurality of SRAM bit cells.

10. The SRAM of claim 1, wherein the SRAM conforms to a twenty-two nanometer (22 nm) scale.

11. The SRAM of claim 1, wherein the second output of the write driver controls a back-gate bias of a first pass gate (PG) transistor but not a back-gate bias of a second PG transistor.

12. The SRAM of claim 1, wherein the SRAM is configured to comply with 6σ design criteria.

13. The SRAM of claim 1 integrated into a semiconductor die.

14. A static random access memory (SRAM), comprising:
    a means for driving a write command comprising two outputs, wherein:
       a first output of the two outputs is connected to a bit line source and a back-gate of a second pull down (PD) back-gate transistor, and
       a second output of the two outputs is connected to a bit line bar source and a back-gate of a first PD back-gate transistor.

15. The SRAM of claim 14, wherein the second output of the means for driving a write command controls a back-gate bias of a first pass gate (PG) means but not a back-gate bias of a second PG means.

16. The SRAM of claim 14, further comprising:
    a first means for inverting comprising a first pull up (PU) transistor and the first pull down (PD) back-gate transistor, the first PU transistor comprising a first back-gate feedback loop and comprising a first width ($W_{PD1}$), and the first PD back-gate transistor comprising a first width ($W_{PD1}$) greater than $W_{PD1}$;
    a second means for inverting comprising a second PU transistor and the second PD back-gate transistor, the second PU transistor comprising a second back-gate feedback loop and comprising a second width ($W_{PD2}$), and the second PD back-gate transistor comprising a second width ($W_{PD2}$) substantially equal to $W_{PD1}$ and greater than $W_{PD2}$;
    a first pass gate (PG) means associated with the first means for inverting, the first PG means comprising a first PG width ($W_{PG1}$) substantially equal to $W_{PD1}$; and
    a second PG means associated with the second means for inverting, the second PG means comprising a second PG width ($W_{PD2}$) substantially equal to $W_{PD2}$.

17. The SRAM of claim 16, wherein the second output of the means for driving a write command controls a back-gate bias of the first PG means but not a back-gate bias of the second PG means.

18. The SRAM of claim 16, wherein the first means for inverting comprises a first inverter.

19. The SRAM of claim 16, wherein the first PG means comprises a first PG transistor.

* * * * *

UNITED STATES PATENT AND TRADEMARK OFFICE
CERTIFICATE OF CORRECTION

PATENT NO. : 9,111,635 B2  
APPLICATION NO. : 13/869110  
DATED : August 18, 2015  
INVENTOR(S) : Seong-Ook Jung et al.

Page 1 of 1

It is certified that error appears in the above-identified patent and that said Letters Patent is hereby corrected as shown below:

In the Specification  
Column 6, line 10, change "first PD transistor" to --second PD transistor--.  
Column 6, line 66, change "157" to --151--.  
Column 7, line 12, change "157" to --151--.

In the Claims  
Claim 2, at column 9, line 46, change "(.sub.WPD2)" to --(W.sub.PD2)--.  
Claim 2, at column 9, line 49, change "(Wp.sub.PG2)" to --(W.sub.PG1)--.  
Claim 2, at column 9, line 52, change "(W.sub.PD2)" to --(W.sub.PG2)--.  
Claim 4, at column 9, line 57, change "first PU transistor" to --first PU back-gate transistor--.  
Claim 4, at column 9, line 58, change "second PU transistor" to --second PU back-gate transistor--.  
Claim 4, at column 9, line 60, change "first PD transistor" to --first PD back-gate transistor--.  
Claim 4, at column 9, line 61, change "second PD transistor" to --second PD back-gate transistor--.  
Claim 8, at column 10, line 18, change "6.sigma.." to --6.sigma.--.  
Claim 16, at column 10, line 47, change "(W.sub.PD1)" to --(W.sub.PU1)--.  
Claim 16, at column 10, line 49, change "W.sub.PD1" to --W.sub.PU1--.  
Claim 16, at column 10, line 53, change "(W.sub.PD2)" to --W.sub.PU2--.  
Claim 16, at column 10, line 56, change "W.sub.PD2" to --W.sub.PG2--.  
Claim 16, at column 10, line 62, change "(W.sub.PD2)" to --W.sub.PG2--.

Signed and Sealed this  
Ninth Day of February, 2016

Michelle K. Lee  
*Director of the United States Patent and Trademark Office*